US010096662B2

(12) United States Patent
Choi et al.

(10) Patent No.: US 10,096,662 B2
(45) Date of Patent: Oct. 9, 2018

(54) ORGANIC LIGHT EMITTING DISPLAY DEVICE INCLUDING A TANDEM STRUCTURE AND METHOD OF MANUFACTURING THE ORGANIC LIGHT EMITTING DISPLAY DEVICE INCLUDING THE TANDEM STRUCTURE

(71) Applicant: SAMSUNG DISPLAY CO., LTD., Yongin-si, Gyeonggi-do (KR)

(72) Inventors: Deok-Young Choi, Suwon-si (KR); Young-Jin Cho, Seoul (KR); Yong-Jae Kim, Seoul (KR); Kyoung-Jin Park, Guri-si (KR); Jin-Gon Oh, Gyeonggi-do (KR); Wang-Jo Lee, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/861,385

(22) Filed: Jan. 3, 2018

(65) Prior Publication Data

US 2018/0145119 A1    May 24, 2018

Related U.S. Application Data

(63) Continuation of application No. 15/391,192, filed on Dec. 27, 2016, now Pat. No. 9,893,128.

(30) Foreign Application Priority Data

Mar. 25, 2016  (KR) .......................... 10-2016-0035871

(51) Int. Cl.
*H01L 29/08*  (2006.01)
*H01L 27/32*  (2006.01)
(Continued)

(52) U.S. Cl.
CPC ........ *H01L 27/3246* (2013.01); *H01L 27/322* (2013.01); *H01L 27/3258* (2013.01);
(Continued)

(58) Field of Classification Search
CPC ............. H01L 27/3246; H01L 51/5072; H01L 51/5096; H01L 27/3276; H01L 51/5215;
(Continued)

(56) References Cited

U.S. PATENT DOCUMENTS 8,263,968 B2     9/2012 Kwok et al.
2014/0061601 A1*  3/2014 Kim .................... H01L 51/0052
                                                            257/40
(Continued)

*Primary Examiner* — Thinh T Nguyen
(74) *Attorney, Agent, or Firm* — F. Chau & Associates, LLC.

(57) ABSTRACT

An organic light emitting display (OLED) device includes a substrate including a light emitting region and a peripheral region. An auxiliary power supply wire is disposed in the peripheral region. A lower electrode is disposed in the light emitting region. A pixel defining layer, disposed on the substrate, exposes a portion of the lower electrode and a portion of the auxiliary power supply wire. A first common layer, disposed on the pixel defining layer and the lower electrode, exposes the auxiliary power supply wire. A light emitting structure is disposed on the first common layer. The light emitting structure exposes the auxiliary power supply wire. A second common layer is disposed on the light emitting structure, the second common layer covering the light emitting structure and exposing the auxiliary power supply wire. An upper electrode is disposed on the second common layer and contacts the auxiliary power supply wire.

14 Claims, 16 Drawing Sheets

(51) Int. Cl.
  *H01L 51/52* (2006.01)
  *H01L 51/56* (2006.01)
  *H01L 51/50* (2006.01)

(52) U.S. Cl.
  CPC ...... *H01L 27/3276* (2013.01); *H01L 51/5215* (2013.01); *H01L 51/5218* (2013.01); *H01L 51/56* (2013.01); *H01L 51/5056* (2013.01); *H01L 51/5072* (2013.01); *H01L 51/5088* (2013.01); *H01L 51/5092* (2013.01)

(58) Field of Classification Search
  CPC ... H01L 51/5092; H01L 51/56; H01L 27/322; H01L 27/3258; H01L 51/5088; H01L 51/5218
  USPC ....... 257/40, 59, 72, 88; 438/82, 99, 48, 128
  See application file for complete search history.

(56) References Cited

U.S. PATENT DOCUMENTS

2015/0287949 A1  10/2015  Okamoto et al.
2016/0285025 A1  9/2016  Park
2017/0278910 A1  9/2017  Choi et al.

\* cited by examiner

ORGANIC LIGHT EMITTING DISPLAY DEVICE INCLUDING A TANDEM STRUCTURE AND METHOD OF MANUFACTURING THE ORGANIC LIGHT EMITTING DISPLAY DEVICE INCLUDING THE TANDEM STRUCTURE

CROSS-REFERENCE TO RELATED APPLICATION(S)

This application is a Continuation of Co-Pending U.S. patent application Ser. No. 15/391,192, filed on Dec. 27, 2016, which claims priority under 35 U.S.C. § 119 to Korean Patent Applications No. 10-2016-0035871, filed on Mar. 25, 2016 in the Korean Intellectual Property Office (KIPO), the contents of which are incorporated by reference herein in their entirety.

TECHNICAL FIELD

Exemplary embodiments of the present invention relate generally to organic light emitting display devices. More particularly, exemplary embodiments of the present inventive concept relate to organic light emitting display devices including a tandem structure and a method of manufacturing the organic light emitting display device including the tandem structure.

DISCUSSION OF THE RELATED ART

A flat panel display (FPD) device is widely used as a display device because the FPD device is lighter and thinner than a cathode-ray tube (CRT) display device. An FPD device may be a liquid crystal display (LCD) device, an organic light emitting display (OLED) device, etc. An OLED device may have a higher luminance and a wider viewing angle than an LCD device. In addition, an OLED device may be thinner than an LCD device because the OLED device does not require a backlight. In an OLED device, electrons and holes are injected into an organic thin layer through a cathode and an anode, and then recombined in the organic thin layer to generate excitors. Accordingly, light of a particular wavelength can be emitted.

Some OLED devices may feature a tandem structure. In the tandem structure, a plurality of light emitting layers and a plurality of charge generating layers are alternately stacked on each other. The tandem structure of an OLED device may thereby emit white light. As an OLED device which includes the tandem structure increases in size, a resistance of a cathode electrode included in the OLED device may be increased. When the resistance of the cathode electrode is increased, an IR-drop (e.g., voltage drop) may be generated in the OLED device. In this case, the OLED device may display an image having uneven brightness because voltage levels that are different from each other, due to the IR-drop, may be applied to a plurality of pixels of the OLED device.

SUMMARY

According to an exemplary embodiment of the present invention, an organic light emitting display (OLED) device includes a tandem structure. The tandem structure includes a plurality of light emitting layers and a plurality of charge generating layers.

According to an exemplary embodiment of the present invention, a method of manufacturing an OLED device including a tandem structure is provided. The tandem structure of the OLED device includes a plurality of light emitting layers and a plurality of charge generating layers.

According to an exemplary embodiment of the present invention, an OLED device includes a substrate including a light emitting region and a peripheral region. An auxiliary power supply wire is disposed in the peripheral region of the substrate. A lower electrode is disposed in the light emitting region of the substrate. A pixel defining layer is disposed on the substrate. The pixel defining layer exposes a portion of the lower electrode in the light emitting region, and the pixel defining layer exposes a portion of the auxiliary power supply wire in the peripheral region. A first common layer is disposed on the pixel defining layer and the lower electrode. The first common layer exposes the auxiliary power supply wire. A light emitting structure is disposed on the first common layer. The light emitting structure exposes the auxiliary power supply wire. The light emitting structure includes a first light emitting layer, a first charge generating layer disposed on the first light emitting layer, and a second light emitting layer disposed on the first charge generating layer. A second common layer is disposed on the light emitting structure, the second common layer covering the light emitting structure. The second common layer exposes the auxiliary power supply wire. An upper electrode is disposed on the second common layer. The upper electrode contacts the auxiliary power supply wire.

In an exemplary embodiment of the present invention, the OLED device further includes a planarization layer interposed between the pixel defining layer and the substrate, the planarization layer including a first opening that exposes a portion of the auxiliary power supply wire.

In an exemplary embodiment of the present invention, the pixel defining layer includes a second opening that exposes a portion of the auxiliary power supply wire, and the pixel defining layer includes a third opening that exposes a portion of the lower electrode.

In an exemplary embodiment of the present invention, the first opening overlaps the second opening, and the first common layer, the first light emitting layer, the first charge generating layer, and the second light emitting layer are sequentially disposed on a sidewall of each of the first and second openings.

In an exemplary embodiment of the present invention, the second common layer covers the first charge generating layer such that the first charge generating layer is not exposed in the sidewall of either of the first and second openings.

In an exemplary embodiment of the present invention, the second common layer covers a distal end portion of the first common layer, a distal end portion of the first light emitting layer, a distal end portion of the first charge generating layer, and a distal end portion of the second light emitting layer in the sidewall of each of the first and second openings, and the second common layer is in contact with an upper surface of the auxiliary power supply wire.

In an exemplary embodiment of the present invention, the lower electrode includes a first transparent electrode layer disposed on the planarization layer, a reflective electrode layer disposed on the first transparent electrode layer, and a second transparent electrode layer disposed on the reflection electrode layer.

In an exemplary embodiment of the present invention, the OLED device further includes a conductive pattern interposed between the auxiliary power supply wire and the upper electrode. The conductive pattern and the lower electrode are simultaneously formed including a same material.

In an exemplary embodiment of the present invention, the OLED device further includes a semiconductor element spaced apart from the auxiliary power supply wire, the semiconductor element being interposed between the substrate and the lower electrode. The semiconductor element includes an active layer disposed on the substrate, a gate insulation layer disposed on the active layer, a gate electrode disposed on the gate insulation layer, an insulating interlayer disposed on the gate electrode, and source and drain electrodes disposed on the insulating interlayer.

In an exemplary embodiment of the present invention, the source and drain electrodes and the auxiliary power supply wire include a same material.

In an exemplary embodiment of the present invention, the OLED device further includes an encapsulation substrate disposed on the upper electrode, and a color filter disposed on a lower surface of the encapsulation substrate, the color filter overlapping the lower electrode.

In an exemplary embodiment of the present invention, the light emitting structure further includes a second charge generating layer disposed on the second light emitting layer and a third light emitting layer disposed on the second charge generating layer. The second common layer covers the second charge generating layer such that the second charge generating layer is not exposed in the light emitting and peripheral regions.

In an exemplary embodiment of the present invention, the first common layer includes a hole injection layer and a hole transport layer, and the second common layer includes an electron transport layer and an electron injection layer.

According to an exemplary embodiment of the present invention, a method of manufacturing an OLED device includes providing a substrate including a light emitting region and a peripheral region. An auxiliary power supply wire is formed in the peripheral region on the substrate. A planarization layer having a first opening is formed on the substrate. The first opening exposes a portion of the auxiliary power supply wire. A lower electrode is formed in the light emitting region on the planarization layer. A pixel defining layer is formed on the planarization layer. The pixel defining layer includes a second opening and a third opening. The second opening exposes a portion of the auxiliary power supply wire in the peripheral region, and the third opening exposes a portion of the lower electrode in the light emitting region. A first common layer is formed on the pixel defining layer, the lower electrode, and the auxiliary power supply wire. A light emitting structure is formed on the first common layer, the light emitting structure including a first light emitting layer, a first charge generating layer, and a second light emitting layer. The first common layer and the light emitting structure are partially removed such that a portion of the auxiliary power supply wire is exposed. A second common layer is formed on the pixel defining layer, the light emitting structure, and the auxiliary power supply wire such that the first charge generating layer is not exposed in a portion where the first common layer and the light emitting structure are partially removed. The second common layer is partially removed such that a portion of the auxiliary power supply wire is exposed. An upper electrode is formed on the pixel defining layer, the light emitting structure, and the auxiliary power supply wire.

In an exemplary embodiment of the present invention, partially removing the first common layer and the light emitting structure such that a portion of the auxiliary power supply wire is exposed includes irradiating the auxiliary power supply wire with a first laser beam, the first laser beam having a first width.

In an exemplary embodiment of the present invention, partially removing the second common layer such that a portion of the auxiliary power supply wire is exposed includes irradiating the auxiliary power supply wire with a second laser beam, the second laser beam having a second width smaller than the first width.

In an exemplary embodiment of the present invention, a first portion of the second common layer, which is disposed on the auxiliary power supply wire, is removed by the second laser beam, and a second portion of the second common layer, which is disposed on the sidewall of the second opening, is not removed by the second laser beam.

In an exemplary embodiment of the present invention, the first opening and the second opening are overlapped, and the first common layer, the first light emitting layer, the first charge generating layer, and the second light emitting layer are sequentially formed in a sidewall of each of the first and second openings. The second common layer covers the first charge generating layer such that the first charge generating layer is not exposed in the sidewall of either of the first and second openings.

In an exemplary embodiment of the present invention, the first common layer includes a hole injection layer and a hole transport layer, and the second common layer includes an electron transport layer and an electron injection layer.

In an exemplary embodiment of the present invention, the method further includes providing an encapsulation substrate, forming a color filter on a lower surface of the encapsulation substrate such that the color filter overlaps the lower electrode, and combining the encapsulation substrate and the substrate.

According to an exemplary embodiment of the present invention, an OLED device includes a substrate including a light emitting region and a peripheral region. An auxiliary power supply wire is disposed in the peripheral region. A lower electrode is disposed in the light emitting region. The lower electrode is electrically connected to a semiconductor device. A pixel defining layer is disposed on the substrate. The pixel defining layer includes a first opening disposed at a first portion of the auxiliary power supply wire and a second opening disposed at a first portion of the lower electrode. A first common layer is disposed on the pixel defining layer and the lower electrode. The first common layer includes a third opening disposed at the first portion of the auxiliary power supply wire. A light emitting structure is disposed on the first common layer. The light emitting structure includes a fourth opening disposed at the first portion of the auxiliary power supply wire. The light emitting structure includes a first light emitting layer, a first charge generating layer disposed on the first light emitting layer, and a second light emitting layer disposed on the first charge generating layer. A second common layer is disposed on the light emitting structure, the second common layer overlapping the light emitting structure. The second common layer includes a fifth opening disposed at the first portion of the auxiliary power supply wire. An upper electrode is disposed on the second common layer. The upper electrode and the auxiliary power supply wire are electrically connected to each other at the first portion of the auxiliary power supply wire.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION OF THE EMBODIMENTS

Exemplary embodiments of the present invention will be explained in detail hereinafter with reference to the accompanying drawings. It will be understood that when a layer or an element is referred to as being on another layer or element, the layer or element can be directly on the other layer or element, or intervening layers or elements may be disposed therebetween.

Figure 1:
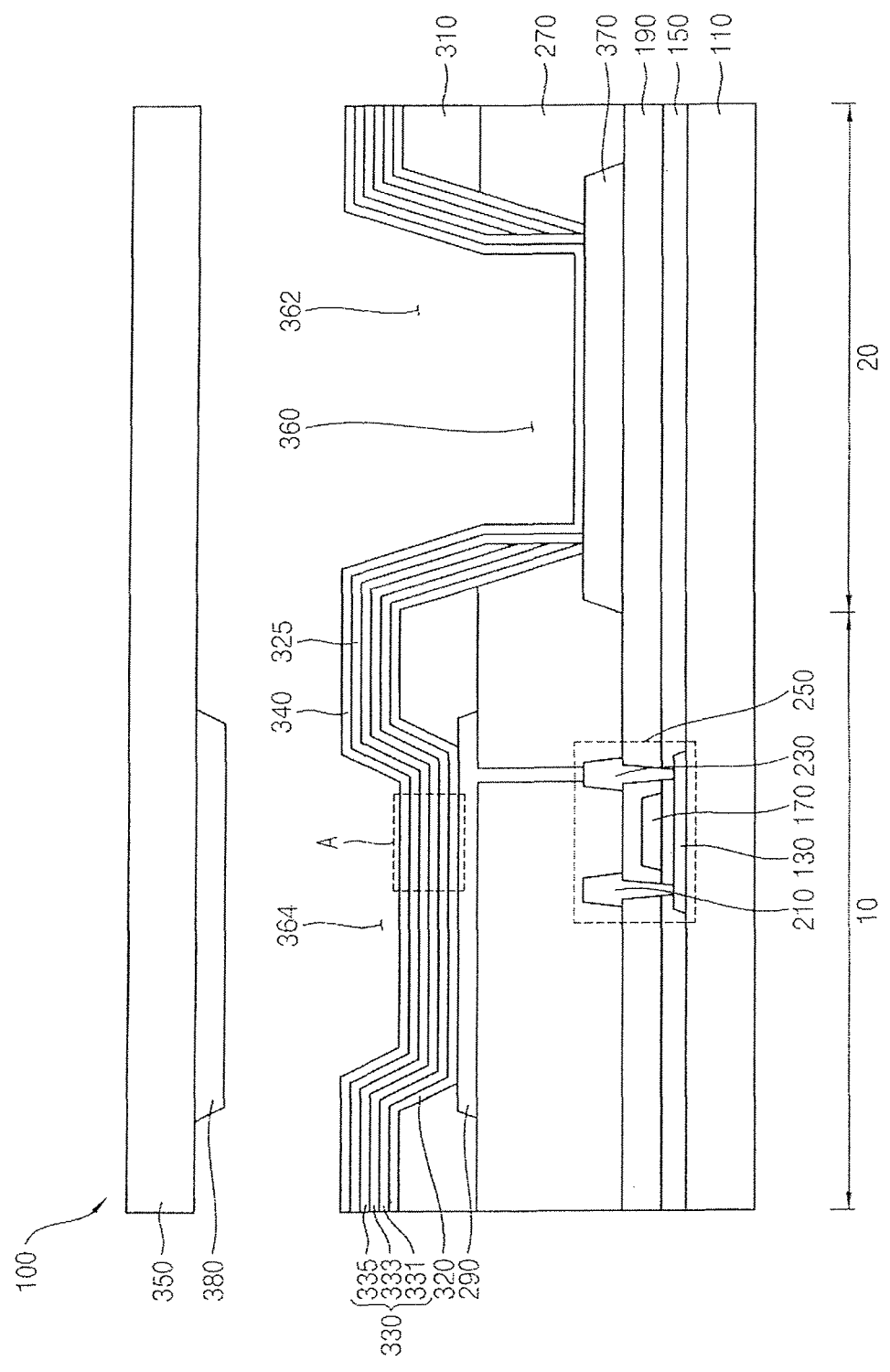
FIG. 1 is a cross-sectional view illustrating an organic light emitting display (OLED) device, according to an exemplary embodiment of the present invention.
Figure 2:
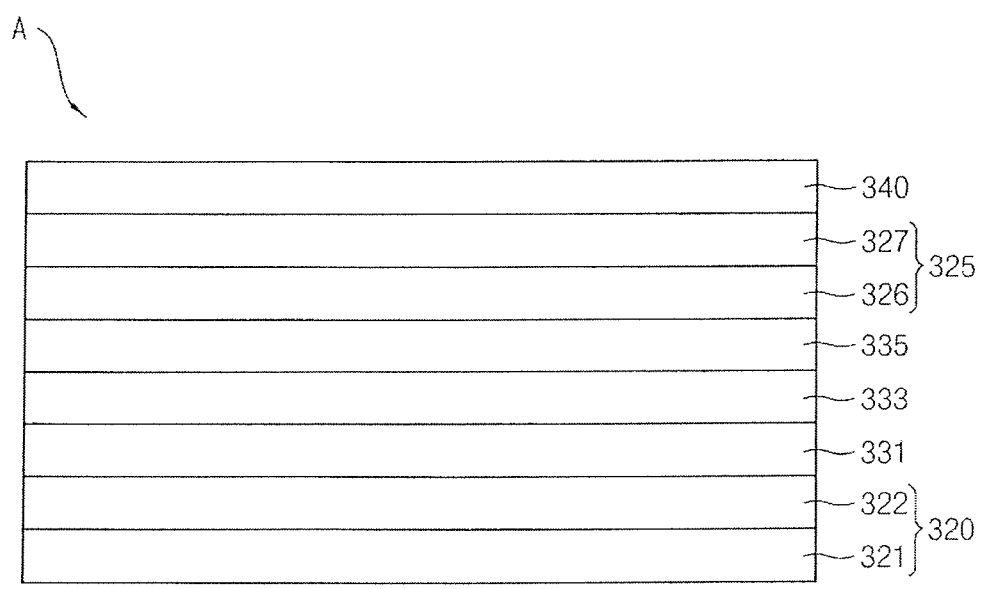
FIG. 2 is an enlarged cross-sectional view of region A of FIG. 1, according to an exemplary embodiment of the present invention.

FIG. 1 is a cross-sectional view illustrating an organic light emitting display (OLED) device, according to an exemplary embodiment of the present invention. FIG. 2 is an enlarged cross-sectional view of region A of FIG. 1, according to an exemplary embodiment of the present invention.

Referring to FIGS. 1 and 2, an organic light emitting display (OLD) device 100 may include a substrate 110, a semiconductor element 250, an auxiliary power supply wire 370, a planarization layer 270, a lower electrode 290, a pixel defining layer 310, a first common layer 320, a light emitting structure 330, a second common layer 325, an upper electrode 340, a color filter 380, an encapsulation substrate 350, etc. The semiconductor element 250 may include an active layer 130, a gate insulation layer 150, a gate electrode 170, an insulating interlayer 190, a source electrode 210, and a drain electrode 230. The light emitting structure 330 may include a first light emitting layer 331, a first charge generating layer (CGL) 333, and a second light emitting layer 335. As illustrated in FIG. 2, the first common layer 320 may include a hole injection layer (HIL) 321 and a hole transport layer (HTL) 322, and the second common layer 325 may include an electron transport layer (ETL) 326 and an electron injection layer (EIL) 327.

The substrate 110 may include a light emitting region 10 and a peripheral region 20. The substrate 110 may include transparent materials. The substrate 110 may include, for example, quartz, synthetic quartz, calcium fluoride, fluoride-doped quartz, sodalime glass, a non-alkali glass, etc. Alternatively, the substrate 110 may include a flexible transparent material such as a flexible transparent resin substrate (e.g., a polyimide substrate). The polyimide substrate may include, for example, a first polyimide layer, a barrier film layer, a second polyimide layer, etc. Since the polyimide substrate is relatively thin and flexible, the polyimide substrate may be disposed on a rigid glass substrate for support during the formation of an upper structure (e.g., the semiconductor element 250, the auxiliary power supply wire 370, the lower electrode 290, the first common layer 320, the light emitting structure 330, the second common layer 325, the upper electrode 340, etc). The substrate 110 may have a structure, for example, in which the first polyimide layer, the barrier film layer and the second polyimide layer are stacked on the rigid glass substrate. When manufacturing the OLED device 100, after an insulating layer (e.g., a buffer layer) is provided on the second polyimide layer of the polyimide substrate, and the upper structure may be disposed on the insulating layer. After the upper structure is formed on the insulating layer, the rigid glass substrate, on which the polyimide substrate is disposed, may be removed. It may be difficult to form the upper structure on the polyimide substrate without supporting the polyimide substrate because the polyimide substrate is relatively thin and flexible. Accordingly, the upper structure may be formed on the polyimide substrate and the rigid glass substrate. Then, the polyimide substrate may serve as the substrate 110 of the OLED device 100 after the removal of the rigid glass substrate.

A buffer layer may be disposed on the substrate 110. The buffer layer may be disposed to cover the entire substrate 110. The buffer layer may prevent the diffusion of metal atoms and/or impurities from the substrate 110 into the semiconductor element 250. Additionally, the buffer layer may control a rate of a heat transfer in a crystallization process for forming the active layer 130. Accordingly, a relatively uniform active layer 130 may be formed. Furthermore, the buffer layer may improve a surface flatness of the substrate 110 when a surface of the substrate 110 is relatively irregular (e.g., stepped, wavy or otherwise not flat). According to the type of the substrate 110, at least two buffer layers may be provided on the substrate 110. Alternatively, a buffer layer might not be disposed on the substrate 110. The buffer layer may include, for example, organic materials or inorganic materials.

The semiconductor element 250 may include the active layer 130, the gate insulation layer 150, the gate electrode 170, the insulating interlayer 190, the source electrode 210, and the drain electrode 230.

The active layer 130 may be disposed in the light emitting region 10 on the substrate 110. The active layer 130 may include, for example, an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130 in the light emitting region 10 on the substrate 110, and may be disposed on the entire substrate 110. For example, the gate insulation layer 150 may cover the active layer 130, and may have an even (e.g., flat) surface without a step around the active layer 130. Alternatively, the gate insulation layer 150 may cover the active layer 130, and may be disposed to have a substantially uniform thickness along a profile of the active layer 130. The gate insulation layer 150 may include a silicon compound, a metal oxide, etc. For example, the gate insulation layer 150 may include silicon oxide (SiOx), silicon nitride (SiNX), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The gate electrode 170 may be disposed on the gate insulation layer 150. The gate electrode 170 may be disposed on the active layer 130 in the light emitting region 10, with a gate insulation layer 150 interposed between the active layer 130 and the gate electrode 170. The gate electrode 170 may include a metallic material, for example, a metal, a metal alloy, metal nitride, a conductive metal oxide, transparent conductive materials, etc. These materials may be used alone or in combination with each other. Alternatively, the gate electrode 170 may have a multilayer structure.

The insulating interlayer 190 may be disposed on the gate insulation layer 150 and the gate electrode 170. The insulating interlayer 190 may cover the gate electrode 170 in the light emitting region 10, and may be disposed on the entire substrate 110. For example, the insulating interlayer 190 may cover the gate electrode 170, and may have an even (e.g., flat) surface without a step around the gate electrode 170. Alternatively, the insulating interlayer 190 may cover the gate electrode 170, and may be disposed to have a uniform thickness along a profile of the gate electrode 170. The insulating interlayer 190 may include a silicon compound, a metal oxide, etc. The insulating interlayer 190 may insulate the gate electrode 170 from contacting the source electrode 210 and the drain electrode 230, which will be formed on the insulating interlayer 190.

The source electrode 210 and the drain electrode 230 may be disposed in the light emitting region 10 on the insulating interlayer 190. The source electrode 210 may be in contact with a first side of the active layer 130 through a contact hole. The contact hole may be formed by removing a portion of the gate insulation layer 150 and the insulating interlayer 190. The drain electrode 230 may be in contact with a second side of the active layer 130 through another contact hole. The other contact hole may be formed by removing a portion of the gate insulation layer 150 and the insulating interlayer 190. Each of the source electrode 210 and the drain electrode 230 may include a metallic material, for example, a metal, an alloy, a metal nitride, a conductive metal oxide, transparent conductive materials, etc. These materials may be used alone or in combination with each other. Alternatively, each of the source electrode 210 and the drain electrode 230 may have a multilayer structure. Accordingly, the semiconductor element 250, including the active layer 130, the gate insulation layer 150, the gate electrode 170, the insulating interlayer 190, the source electrode 210, and the drain electrode 230, may be disposed on the substrate 110.

In an exemplary embodiment of the present invention, the semiconductor element 250 of the OLED device 100 has a top gate structure, but the structure of the semiconductor element 250 is not limited thereto. For example, in an exemplary embodiment of the present invention, the semiconductor element 250 may have a bottom gate structure.

In addition, the semiconductor element 250 of the OLED device 100 may be disposed in the light emitting region 10. However, the location where the semiconductor element 250 is disposed is not limited to the light emitting region 10. For example, the semiconductor element 250 may be disposed in the peripheral region 20.

The auxiliary power supply wire 370 may be disposed in the peripheral region 20 on the insulating interlayer 190. The auxiliary power supply wire 370 may be spaced apart from the semiconductor element 250 (e.g., the source electrode 210 and the drain electrode 230).

When an OLED device becomes larger in size, a resistance of an upper electrode may be increased. When the resistance of the upper electrode is increased, an IR-Drop (e.g., voltage drop) may be generated in the OLED device. Accordingly, a luminance of the OLED device may be uneven. In an exemplary embodiment of the present invention, the OLED device 100 may further include the auxiliary power supply wire 370 to reduce the IR-drop. The auxiliary power supply wire 370 may be in direct contact with the upper electrode 340. The auxiliary power supply wire 370 may be a low power supply voltage wire, through which a low power supply voltage is provided. The low power supply voltage may be applied, for example, to the auxiliary power supply wire 370, and the auxiliary power supply wire 370 may provide the low power supply voltage to the upper electrode 340. The auxiliary power supply wire 370 may include a metallic material, example, a metal, a metal alloy, metal nitride, a conductive metal oxide, transparent conductive materials, etc. For example, the auxiliary power supply wire 370 may include aluminum (Al), an alloy of aluminum, aluminum nitride (AlNx), silver (Ag), an alloy of silver, tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These materials may be used alone or in combination with each other. Alternatively, the auxiliary power supply wire 370 may have a multilayer structure. In an exemplary embodiment of the present invention, the source electrode 210, the drain electrode 230, and the auxiliary power supply wire 370 may be simultaneously formed using the same material.

The planarization layer 270 may be disposed on the insulating interlayer 190, the source electrode 210, the drain electrode 230, and a portion of the auxiliary power supply wire 370. The planarization layer 270 may cover both lateral portions of the auxiliary power supply wire 370 in the peripheral region 20. In an exemplary embodiment of the present invention, the planarization layer 270 may be interposed between the pixel defining layer 310 and the substrate 110. In addition, the planarization layer 270 may have a first opening 360 that exposes a portion of the auxiliary power supply wire 370 in the peripheral region 20. The planarization layer 270 may be relatively thick so to cover the insulating interlayer 190, the source electrode 210, and the drain electrode 230. In this case, the planarization layer 270 may have an even (e.g., flat) upper surface. In addition, a planarization process may be further performed on the planarization layer 270 to flatten the upper surface of the planarization layer 270. The planarization layer 270 may include organic materials or inorganic materials. In an exemplary embodiment of the present invention, the planarization layer 270 may include organic materials. The planarization layer 270 may include, for example, a photoresist, a polyacryl-based resin, a polyimide-based resin, a polyamide-based resin, a siloxane-based resin, an acryl-based resin, an epoxy-based resin, etc.

The lower electrode 290 may be disposed in the light emitting region 10 on the planarization layer 270. A thickness of the lower electrode 290 may be greater than that of the upper electrode 340 such that a light emitted from the light emitting structure 330 may be reflected in a direction toward the encapsulation substrate 350 (e.g., toward the front of the OLED device 100). The lower electrode 290 may be in contact with the drain electrode 230 through a contact hole. The contact hole may be formed by removing a portion of the planarization layer 270. In addition, the lower electrode 290 may be electrically connected to the semiconductor element 250. The lower electrode 290 may include a metallic material, for example, a metal, a metal alloy, metal nitride, a conductive metal oxide, transparent conductive materials, etc. These materials may be used alone or in combination with each other. Alternatively, the lower electrode 290 may have a multilayer structure.

The pixel defining layer 310 may be disposed on a portion of the lower electrode 290 and the planarization layer 270 such that the pixel defining layer 310 exposes the auxiliary power supply wire 370 in the peripheral region 20. The pixel defining layer 310 may cover both lateral portions of the lower electrode 290. In an exemplary embodiment of the present invention, the pixel defining layer 310 may have a second opening 362, exposing a portion of the auxiliary power supply wire 370 in the peripheral region 20, and a third opening 364, exposing a portion of the lower electrode 290 in the light emitting region 10. The first opening 360 and the second opening 362 may be overlapped. A size of the second opening 362 may be greater than a size of the first opening 360. The pixel defining layer 310 may include organic materials or inorganic materials. In an exemplary embodiment of the present invention, the pixel defining layer 310 may include only organic materials.

The first common layer 320 may be disposed on the pixel defining layer 310 and the lower electrode 290. The first common layer 320 may expose a portion of the auxiliary power supply wire 370. The first common layer 320 may be disposed on a sidewall of the first and second openings 360 and 362. As described above, the first common layer 320 may include the HIL 321 and the HTL 322. The HIL 321 may be disposed on the planarization layer 270, and the HTL 322 may be disposed on the HIL 321. The HIL 321 may include a hole injection material, for example, (N-carbazolyl)triphenylamine (TCTA) or 4,4',4"-tris[3-methylphenyl (phenyl)amino]triphenylamine (m-MTDATA). The HTL 322 may include a hole transport material, for example, 4,4'-bis[-(1-naphtyl)-N-phenylamino]¬biphenyl (NPB), 4,4'-bis[N-(3-methylphenyl)-N-phenylamino] biphenyl (TPD), N,N'-di-1-naphtyl-N,N'-diphenyl-1,1'-biphenyl-4,4'-diamine (NPD), N-phenylcarbazole, polyvinylcarbazole or a combination thereof.

The light emitting structure 330 may be disposed on the first common layer 320. The light emitting structure 330 may expose a portion of the auxiliary power supply wire 370. The light emitting structure 330 may be disposed on the first common layer 320, in the sidewall of each of the first and second openings 360 and 362. As described above, the light emitting structure 330 may include the first light emitting layer 331, the first CGL 333, and the second light emitting layer 335. For example, in the sidewall of each of the first and second openings 360 and 362, the first light emitting layer 331 may be disposed on the first common layer 320, and the first CGL 333 may be disposed on the first light emitting layer 331. In addition, in the sidewall of each of the first and second openings 360 and 362, the second light emitting layer 335 may be disposed on the first CGL 333. In an exemplary embodiment of the present invention, the light emitting structure 330 may have a tandem structure.

The first light emitting layer 331 may emit light having a first wavelength and light having a second wavelength. The second wavelength may be, for example, different from the first wavelength. Here, the light having the first wavelength and the light having second wavelength may be mixed with each other, and light having a yellow color may be generated. For example, the light having the first wavelength may be light having a red color, and the light having the second wavelength may be light having a green color. The first light emitting layer 331 may include emission materials of red and green. Alternatively, the light having a first wavelength may be light having a green color, and the light having a second wavelength may be light having a red color.

The first CGL 333 may include an n-type aryl amine-based layer and a p-type metal oxide layer. Here, when a voltage is applied to the n-type aryl amine-based layer and the p-type metal oxide layer, an oxidation-reduction reaction may occur, and a charge may be generated after a complex is formed. The first CGL 333 may include aryl amine-based organic compounds a metal material, for example, metal oxide, metal carbides, metal fluorides, etc. These compounds and/or materials may be used alone or in combination with each other. Alternatively, the gate electrode 170 may have a multilayer structure. For example, the aryl amine-based organic compounds may include α-NPD, 2-TNATA, TDATA, MTDATA, spiro-TAD, sprio-NPB, etc, and the metal material may include cesium (Cs), Mo, Ti, W, barium (Ba), lithium (Li), etc. In addition, the metal oxide, the metal carbides, and the metal fluorides may include $Re_2O_7$, $MoO_3$, $V_2O_5$, $WO_3$, $TiO_2$, $Cs_2CO_3$, barium fluoride (BaF), lithium fluoride (LiF), cesium fluoride (CsF), etc.

The second light emitting layer 335 may emit a light having a third wavelength. The light having the third wavelength may be, for example, light that has a different color from the light having the first wavelength and the light having the second wavelength. The light having the third wavelength may be a light having a blue color. The second light emitting layer 335 may include emission materials of a blue color. Accordingly, the light having the first wavelength and the light having the second wavelength, which are emitted from the first light emitting layer 331, and the light having the third wavelength, which is emitted from the second light emitting layer 335, may be mixed. Thus, the light resulting from mixing the light having the first wavelength, the light having the second wavelength, and the light having the third wavelength may be light having a white color. Alternatively, the first light emitting layer 331 may include yellow-green phosphor materials, and the second light emitting layer 335 may include a blue fluorescent material. In this case, the second light emitting layer 335 may generate light having a blue color by using the blue fluorescent material, and the first light emitting layer 331 may generate light of a yellow-green color by using the yellow-green phosphor materials. Light having a white color may be generated by mixing the blue and yellow-green colored lights.

The second common layer 325 may be disposed on the light emitting structure 330. In addition, the second common layer 325 may cover the light emitting structure 330, and may expose a portion of the auxiliary power supply wire 370. The second common layer 325 may be disposed on the light emitting structure 330, in the sidewall of each of the first and second openings 360 and 362. As described above, the second common layer 325 may include the ETL 326 and the EIL 327. For example, in the sidewall of each of the first and second openings 360 and 362, the ETL 326 may be disposed on the light emitting structure 330 (e.g., the second light emitting layer 335). The EIL 327 may be disposed on the ETL 326. In an exemplary embodiment of the present invention, the second common layer 325 may cover the first CGL 333 such that the first CGL 333 is not exposed in the sidewall of each of the first and second openings 360 and 362. For example, in the sidewall of each of the first and second openings 360 and 362, the second common layer 325 may cover a distal end portion of the first common layer 320, a distal end portion of the first light emitting layer 331, a distal end portion of the first CGL 333, and a distal end portion of the second light emitting layer 335. In this case, the distal end portion of the first common layer 320, the distal end portion of the first light emitting layer 331, the distal end portion of the first CGL 333, and the distal end portion of the second light emitting layer 335, respectively, may be ends that face the auxiliary power supply wire 370. In addition, in the first and second openings 360 and 362, the second common layer 325 may be in contact with a portion of an upper surface of the auxiliary power supply wire 370. Accordingly, the light emitting structure 330, including the first light emitting layer 331, the first CGL 333, and the second light emitting layer 335, may be disposed in the sidewall of each of the first and second openings 360 and 362.

In an exemplary embodiment of the present invention, the tandem structure of the OLED device 100 includes the first light emitting layer 331, the first CGL 333, and the second light emitting layer 335. However, the tandem structure of the OLED device is not limited thereto. For example, in an exemplary embodiment of the present invention, the tandem structure may include the first common layer 320, the first light emitting layer 331, the first CGL 333, the second light emitting layer 335, and the second common layer 325.

When the second common layer 325 does not cover the first CGL 333, the first CGL 333 may be exposed and may directly contact the upper electrode 340. In this case, the first CGL 333 and the upper electrode 340 may be shorted (e.g., in electrical contact with each other). When the first CGL 333 and the upper electrode 340 are shorted, the light having a white color might not be emitted from the light emitting region 10. Since the second common layer 325 covers the first CGL 333, the second common layer 325 may electrically insulate the first CGL 333 from the upper electrode 340. Accordingly, the first CGL 333 and the upper electrode 340 might not be shorted. As a result, light having a white color may be emitted from the light emitting region 10.

The ETL 326 may include an electron transport material, for example, tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), triazole (TAZ), phenylquinozaline or a combination thereof. The EIL 327 may include an electron injection material, for example, LiF, Lithium quinolate (LiQ), Li2O, BaO, NaCl, CsF, etc.

The upper electrode 340 may be disposed on the second common layer 325 and the auxiliary power supply wire 370. The upper electrode 340 may cover the second common layer 325. The upper electrode 340 may be in direct contact with the auxiliary power supply wire 370. The upper electrode 340 may include a metal, a metal alloy, metal nitride, a conductive metal oxide, transparent conductive materials, etc.

The encapsulation substrate 350 may be disposed on the upper electrode 340. The encapsulation substrate 350 and the substrate 110 may include a same material. For example, the encapsulation substrate 350 may include quartz, synthetic quartz, calcium fluoride, fluoride-doped quartz, sodalime glass, a non-alkali glass etc. In an exemplary embodiment of the present invention, the encapsulation substrate 350 may include a transparent inorganic material or a flexible plastic. For example, the encapsulation substrate 350 may include a flexible transparent resin. In this case, to increase flexibility of the OLED device 100, the encapsulation substrate 350 may include a stacked structure where at least one inorganic layer and at least one organic layer are alternately stacked.

The color filter 380 may be disposed on a lower surface of the encapsulation substrate 350, and may overlap the lower electrode 290. The color filter 380 may include a red color filter, a green color filter, and/or a blue color filter. Alternatively, the color filter 380 may include a yellow color filter, a cyan color filter, and/or a magenta color filter. The color filter 380 may include a photosensitive resin (or color photoresist), etc.

The OLED device 100, according to an exemplary embodiment of the present invention, includes the second common layer 325 covering the first CGL 333. As the second common layer 325 covers the first CGL 333, the first CGL 333 and the upper electrode 340 may be electrically insulated from each other. Accordingly, the first CGL 333 and the upper electrode 340 might not be shorted, and the OLED device 100 may emit light having a white color in the light emitting region 10. In addition, since the OLED device 100 includes the auxiliary power supply wire 370, an IR-drop (e.g., voltage drop) generated in the OLED device 100 may be reduced. Accordingly, the OLED device 100 may display an image having a uniform brightness.

FIGS. 3, 4, 5, 6, 7, 8, 9, 10, 11, 12, and 13 are cross-sectional views illustrating a method of manufacturing an OLED device according to an exemplary embodiment of the present invention.

Figure 3:
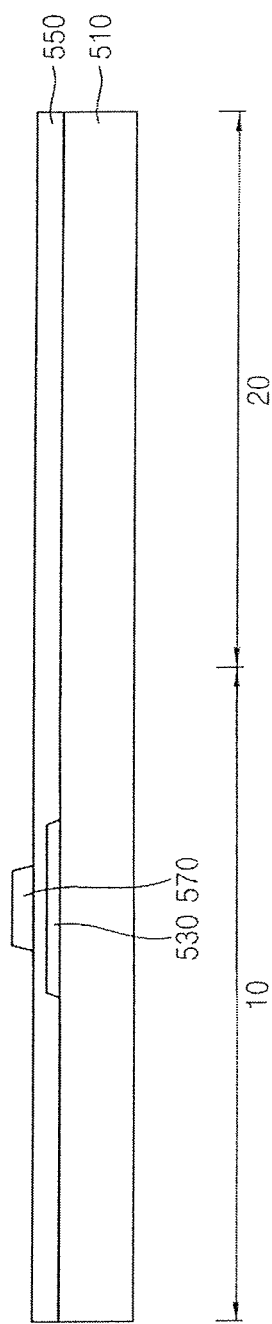
FIGS. 3, 4, 5, 6, 7, 8, 9, 10, 11, 12, and 13 are cross-sectional views illustrating a method of manufacturing an OLED device according to an exemplary embodiment of the present invention.

Referring to FIG. 3, a substrate 510 may include a light emitting region 10 and a peripheral region 20. The substrate 510 may include transparent materials. For example, the substrate 510 may include quartz, synthetic quartz, calcium fluoride, fluoride-doped quartz, sodalime glass, a non-alkali glass etc. Alternatively, the substrate 510 may include a flexible transparent material such as a flexible transparent resin substrate (e.g., a polyimide substrate).

A buffer layer may be formed on the substrate 510. The buffer layer may be formed on the entire substrate 510. The buffer layer may prevent the diffusion of metal atoms and/or impurities from the substrate 510 into a semiconductor element. Additionally, the buffer layer may control a rate of a heat transfer in a crystallization process for forming an active layer, to obtain a uniform active layer. Furthermore, the buffer layer may make the substrate 510 more flat when a surface of the substrate 510 is relatively irregular (e.g., stepped, wavy or otherwise not flat). According to the type of the substrate 510, at least two buffer layers may be provided on the substrate 510. Alternatively, a buffer layer might not be disposed on the substrate 510. For example, the buffer layer may be formed using organic materials or inorganic materials.

An active layer 530 may be formed in the light emitting region 10 on the substrate 510. For example, the active layer 530 may be formed using an oxide semiconductor, an inorganic semiconductor, an organic semiconductor, etc.

A gate insulation layer 550 may be formed on the active layer 530. The gate insulation layer 550 may cover the active layer 530 in the light emitting region 10 on the substrate 510, and may be formed on the entire substrate 510. For example, the gate insulation layer 550 may cover the active layer 530. In addition, the gate insulation layer 550 may have an even (e.g., flat) surface without a step around the active layer 530. Alternatively, the gate insulation layer 550 may cover the active layer 530, and may be disposed to have a uniform thickness along a profile of the active layer 530. The gate insulation layer 550 may include a silicon compound, a metal oxide, etc. For example, the gate insulation layer 550 may be formed using $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, etc.

A gate electrode 570 may be formed on the gate insulation layer 550. The gate electrode 570 may be formed on the active layer 530 to overlap the active layer 530 in the light emitting region 10. The gate electrode 570 may be formed using a metallic material, for example, a metal, a metal alloy, metal nitride, a conductive metal oxide, transparent conductive materials, etc. These materials may be used alone or in combination with each other. Alternatively, the gate electrode 570 may be formed in a multilayer structure.

Figure 4:
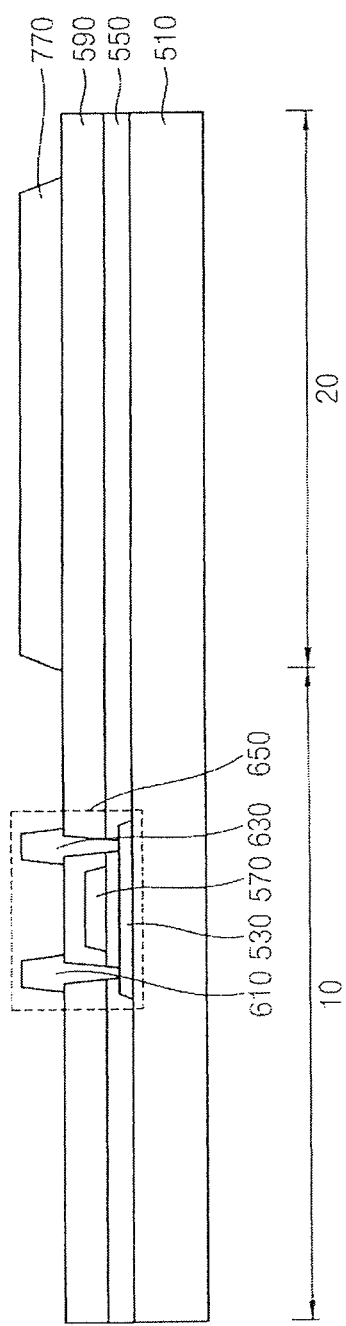

Referring to FIG. 4, an insulating interlayer 590 may be formed in the light emitting region 10 on the gate insulation layer 550 and the gate electrode 570. The insulating interlayer 590 may cover the gate electrode 570 in the light emitting region 10, and may be formed on the entire substrate 510. For example, the insulating interlayer 590 may cover the gate electrode 570, and may have an even (e.g., flat) surface without a step around the gate electrode 570. Alternatively, the insulating interlayer 590 may cover the gate electrode 570, and may be formed to have a substantially uniform thickness along a profile of the gate electrode 570. The insulating interlayer 590 may be formed using a silicon compound, a metal oxide, etc.

A source electrode 610 and a drain electrode 630 may be formed in the light emitting region 10 on the insulating interlayer 590. The source electrode 610 may be in contact with a first side of the active layer 530 through a contact hole. The contact hole may be formed by removing a portion of the gate insulation layer 550 and the insulating interlayer 590. The drain electrode 630 may be in contact with a second side of the active layer 530 through a contact hole. The contact hole may be formed by removing a portion of the gate insulation layer 550 and the insulating interlayer 590. Each of the source electrode 610 and the drain electrode 630 may be formed using a material, for example, a metal, an alloy, metal nitride, a conductive metal oxide, transparent conductive materials, etc. These materials may be used alone or in combination with each other. Accordingly, a semiconductor element 650 including the active layer 530, the gate insulation layer 550, the gate electrode 570, the insulating interlayer 590, the source electrode 610, and the drain electrode 630 may be formed on the substrate 510.

An auxiliary power supply wire 770 may be formed in the peripheral region 20 on the insulating interlayer 590. The auxiliary power supply wire 770 may be spaced apart from the source electrode 610 and the drain electrode 630. The auxiliary power supply wire 770 may be formed using a metallic material, for example, a metal, a metal alloy, metal nitride, a conductive metal oxide, transparent conductive materials, etc. For example, the auxiliary power supply wire 770 may include Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, IZO, etc. These materials may be used alone or in combination with each other. Alternatively, the auxiliary power supply wire 770 may have a multilayer structure. In an exemplary embodiment of the present invention, the source electrode 610, the drain electrode 630, and the auxiliary power supply wire 770 may be simultaneously formed using the same material. For example, a preliminary metal layer may be formed on the entire insulating interlayer 590. After the preliminary metal layer is formed, the source electrode 610, the drain electrode 630, and the auxiliary power supply wire 770 may be formed by patterning the preliminary metal layer.

Figure 5:
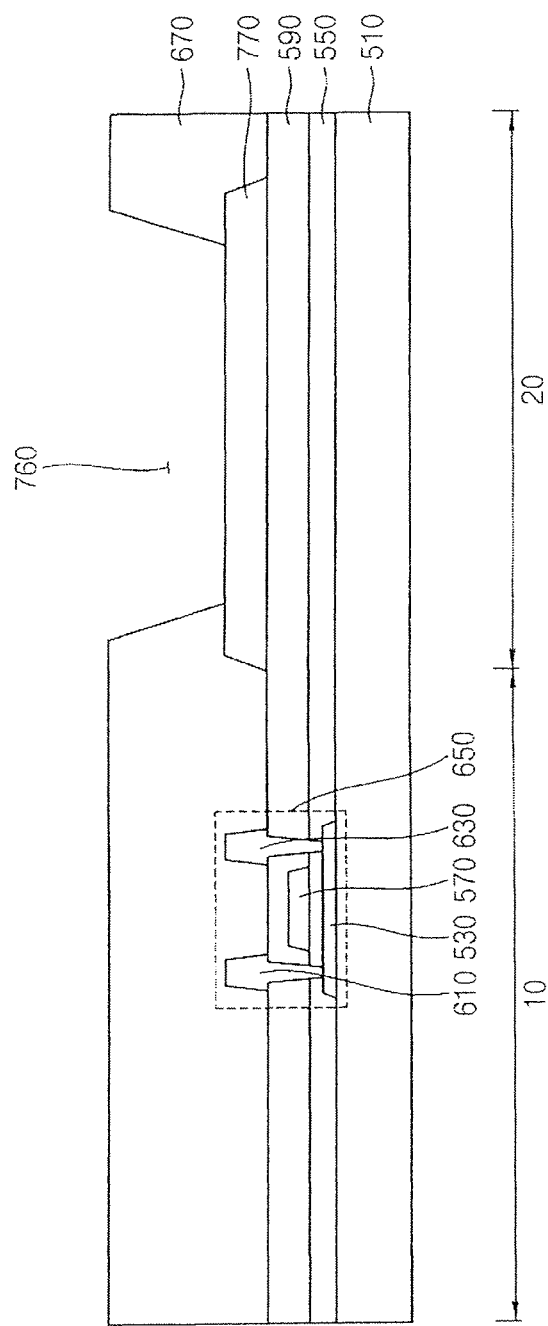

Referring to FIG. 5, a planarization layer 670 may be formed on the insulating interlayer 590, the source electrode 610, the drain electrode 630, and a portion of the auxiliary power supply wire 770. The planarization layer 670 may cover both lateral portions of the auxiliary power supply wire 770 in the peripheral region 20. In an exemplary embodiment of the present invention, the planarization layer 670 may have a first opening 760 exposing a portion of the auxiliary power supply wire 770 in the peripheral region 20. For example, the planarization layer 670 may be formed to be relatively thick so as to cover the insulating interlayer 590, the source electrode 610, and the drain electrode 630. In this case, the planarization layer 670 may have an even upper surface. In addition, a planarization process may be further performed on the planarization layer 670 to create the even (e.g., flat) upper surface of the planarization layer 670. The planarization layer 670 may include organic materials or inorganic materials. In an exemplary embodiment of the present invention, the planarization layer 670 may be formed using organic materials. For example, the planarization layer 670 may include a photoresist, a polyacryl-based resin, a polyimide-based resin, a polyamide-based resin, a siloxane-based resin, an acryl-based resin, an epoxy-based resin, etc.

Figure 6:
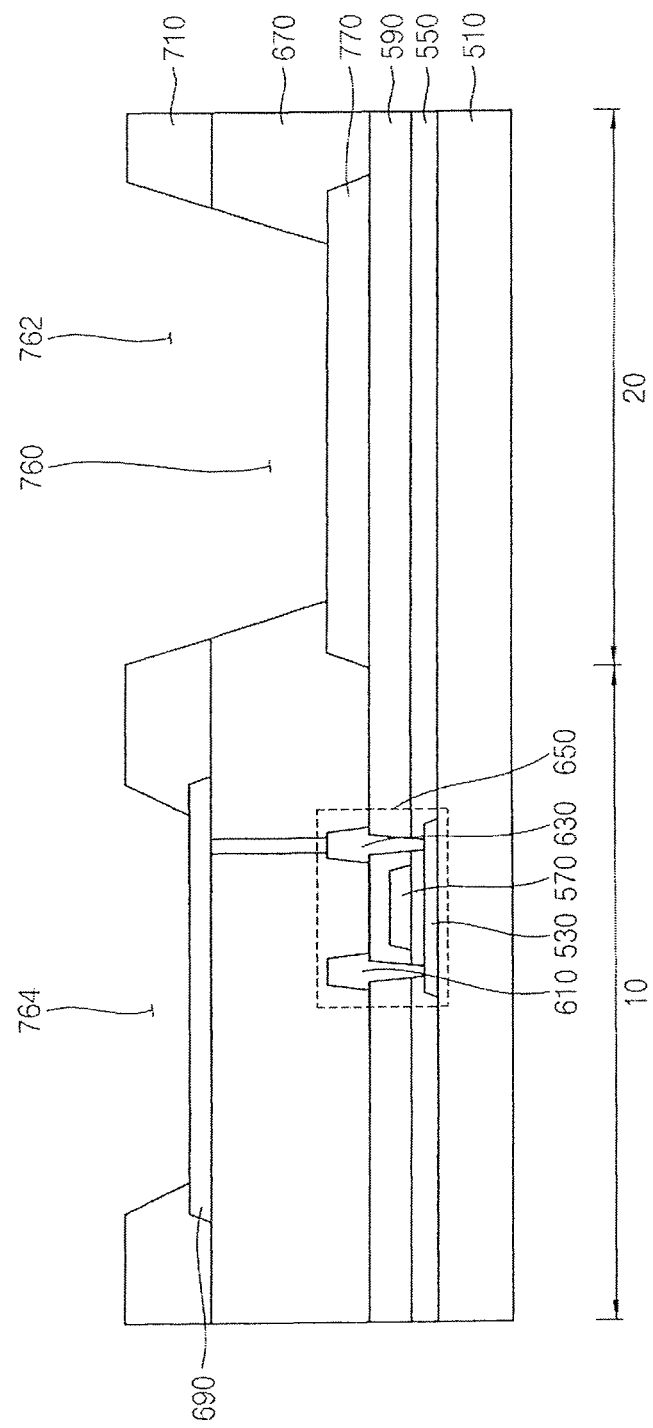

Referring to FIG. 6, a lower electrode 690 may be formed in the light emitting region 10 on the planarization layer 670. The lower electrode 690 may be in contact with the drain electrode 630 to fill the contact hole formed by removing a portion of the planarization layer 670. In addition, the lower electrode 690 may be electrically connected to the semiconductor element 650. For example, the lower electrode 690 may be formed using a metallic material, for example, a metal, a metal alloy, metal nitride, a conductive metal oxide, transparent conductive materials, etc. These materials may be used alone or in combination with each other. Alternatively, the lower electrode 690 may have a multilayer structure.

A pixel defining layer 710 may be formed on a portion of the lower electrode 690 and the planarization layer 670 such that the pixel defining layer 710 exposes the auxiliary power supply wire 770. The auxiliary power supply wire 770 may be formed in the peripheral region 20. The pixel defining layer 710 may cover both lateral portions of the lower electrode 690. In an exemplary embodiment of the present invention, the pixel defining layer 710 may have a second opening 762 exposing a portion of the auxiliary power supply wire 770 in the peripheral region 20, and a third opening 764 exposing a portion of the lower electrode 690 in the light emitting region 10. The first opening 760 and the second opening 762 may be overlapped. A size of the second opening 762 may be greater than that of the first opening 760. The pixel defining layer 710 may include organic materials or inorganic materials. In an exemplary embodiment of the present invention, the pixel defining layer 710 may be formed using only organic materials.

Figure 7:
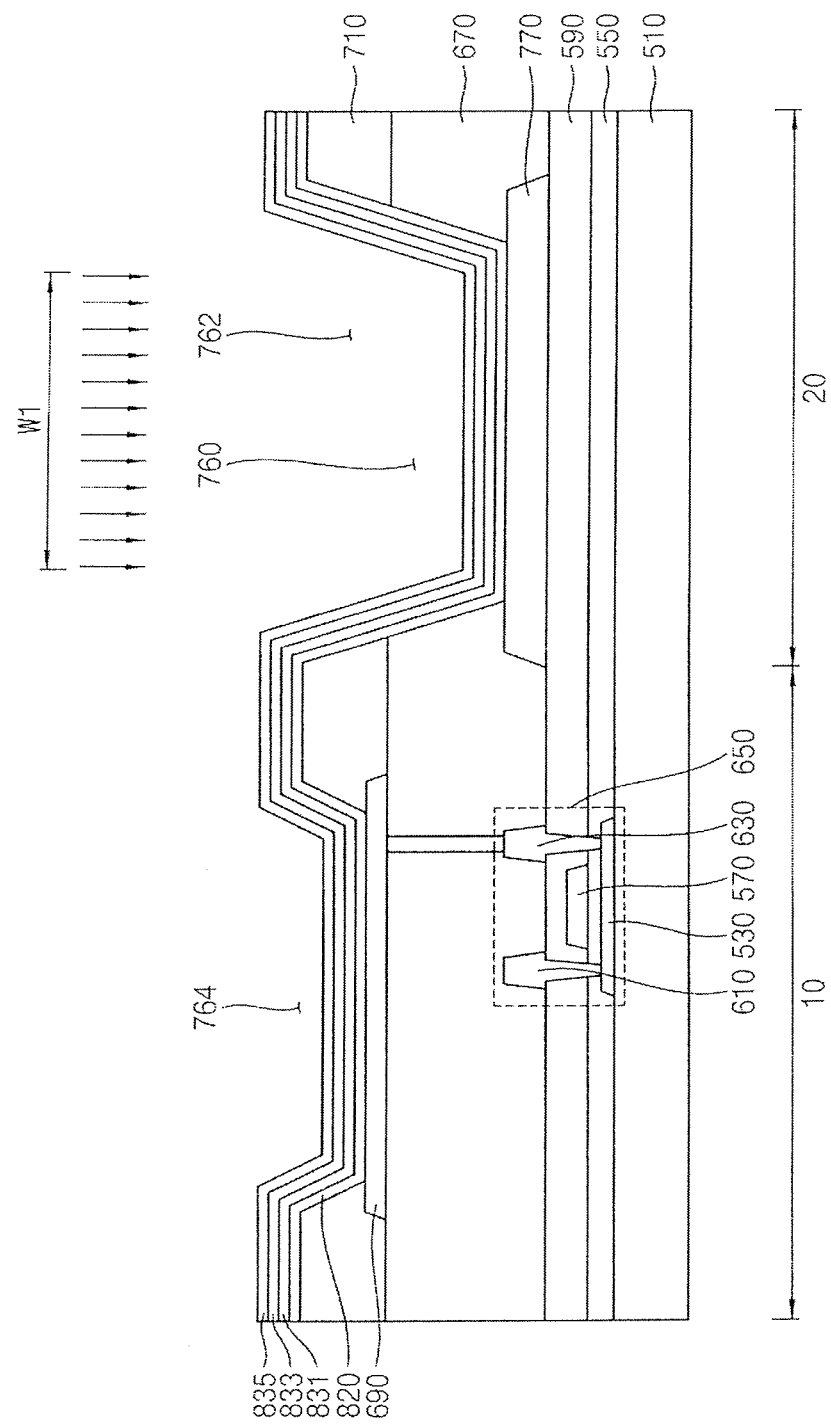

Referring to FIG. 7, a preliminary first common layer 820, a preliminary first light emitting layer 831, a preliminary first charge generating layer (CGL) 833, and a preliminary second light emitting layer 835 may be sequentially formed on the entire substrate 510. For example, the preliminary first common layer 820 may be formed on the pixel defining layer 710, the lower electrode 690, and the auxiliary power supply wire 770. The preliminary first light emitting layer 831 may be formed on the preliminary first common layer 820. In addition, the preliminary first CGL 833 may be formed on the preliminary first light emitting layer 831. The preliminary second light emitting layer 835 may be formed on the preliminary first CGL 833. After the preliminary first common layer 820, the preliminary first light emitting layer 831, the preliminary first CGL 833, and the preliminary second light emitting layer 835 are formed, a first width W1 on the auxiliary power supply wire 770 may be irradiated by a laser beam such that a portion of the auxiliary power supply wire 770 is exposed. For example, the laser beam may have the first width W1.

Figure 8:
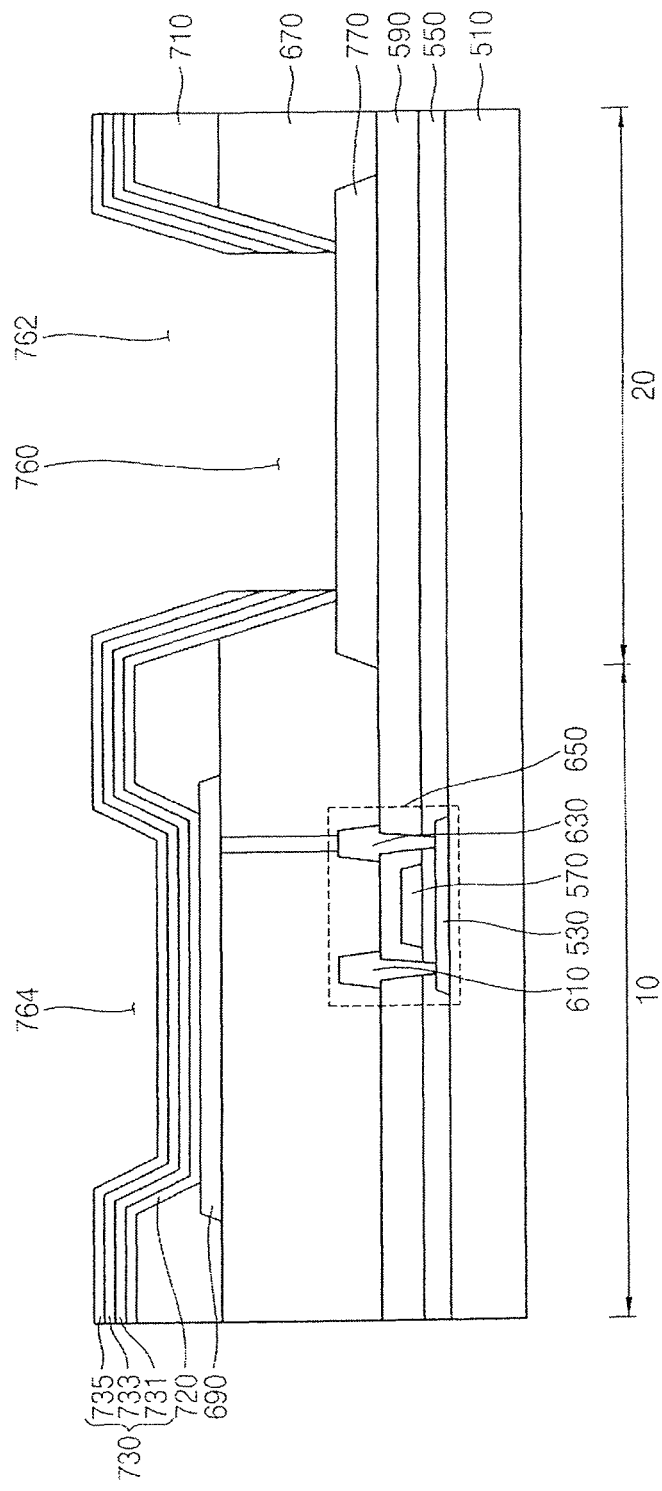

Referring to FIG. 8, after auxiliary power supply wire 770 is irradiated with the laser beam having the first width W1, a light emitting structure 730 may be formed. The light emitting structure 730 may include a first common layer 720, a first light emitting layer 731, a first CGL 733, and a second light emitting layer 735.

The first common layer 720 may be formed on the pixel defining layer 710 and the lower electrode 690. The first common layer 720 may expose a portion of the auxiliary power supply wire 770. The first common layer 720 may be formed on a sidewall of the first and second opening 760 and 762. The first common layer 720 may include an HIL and an HTL (refer to FIG. 2). The HIL may be formed on the planarization layer 670, and the HTL may be formed on the HIL. For example, the HIL may be formed using a hole injection material, and the HTL may be formed using a hole transport material.

A light emitting structure 730 may be formed on the first common layer 720, and may expose a portion of the auxiliary power supply wire 770. The light emitting structure 730 may be formed on the first common layer 720, in the sidewall of the first and second openings 760 and 762. For example, in the sidewall of the first and second openings 760 and 762, the first light emitting layer 731 may be formed on the first common layer 720. In addition, the first CGL 733 may be formed on the first light emitting layer 731. The second light emitting layer 735 may be formed on the first CGL 733. In an exemplary embodiment of the present invention, the light emitting structure 730 may have a tandem structure.

The first light emitting layer 731 may emit light having a first wavelength and light having a second wavelength. The first and second wavelengths may be different from each other. Here, the light having the first wavelength and the light of second wavelength may be mixed, and light having a yellow color may be generated. For example, the light having the first wavelength may be light having a red color, and the light having the second wavelength may be light having a green color. Alternatively, the light having the first wavelength may be light having a green color, and the light having the second wavelength may be light having a red color.

The first CGL 733 may be formed using an n-type aryl amine-based layer and a p-type metal oxide layer. The first CGL 733 may include aryl amine-based organic compounds, a metal, metal oxide, metal carbides, metal fluorides, etc. These compounds and/or materials may be used alone or in combination with each other.

The second light emitting layer 735 may emit a light of a third wavelength, for example, light that is different from the light having the first wavelength and the light having the second wavelength. Here, the light of the third wavelength may be light having a blue color. The light having the first wavelength and the light having the second wavelength, which are emitted from the first light emitting layer 731, and the light having the third wavelength, emitted from the second light emitting layer 735, may be mixed. Thus, the light resulting from mixing light having the first wavelength, the light having the second wavelength, and the light having the third wavelength may be light having a white color. Alternatively, the first light emitting layer 731 may be formed using yellow-green phosphor materials, and the second light emitting layer 735 may be formed using a blue fluorescent material. In this case, the second light emitting layer 735 may generate light having a blue color by using the blue fluorescent material, and the first light emitting layer 731 may generate light of a yellow-green color by using the yellow-green phosphor materials. Light having a white color may be generated by mixing the blue and yellow-green colored lights.

Figure 9:
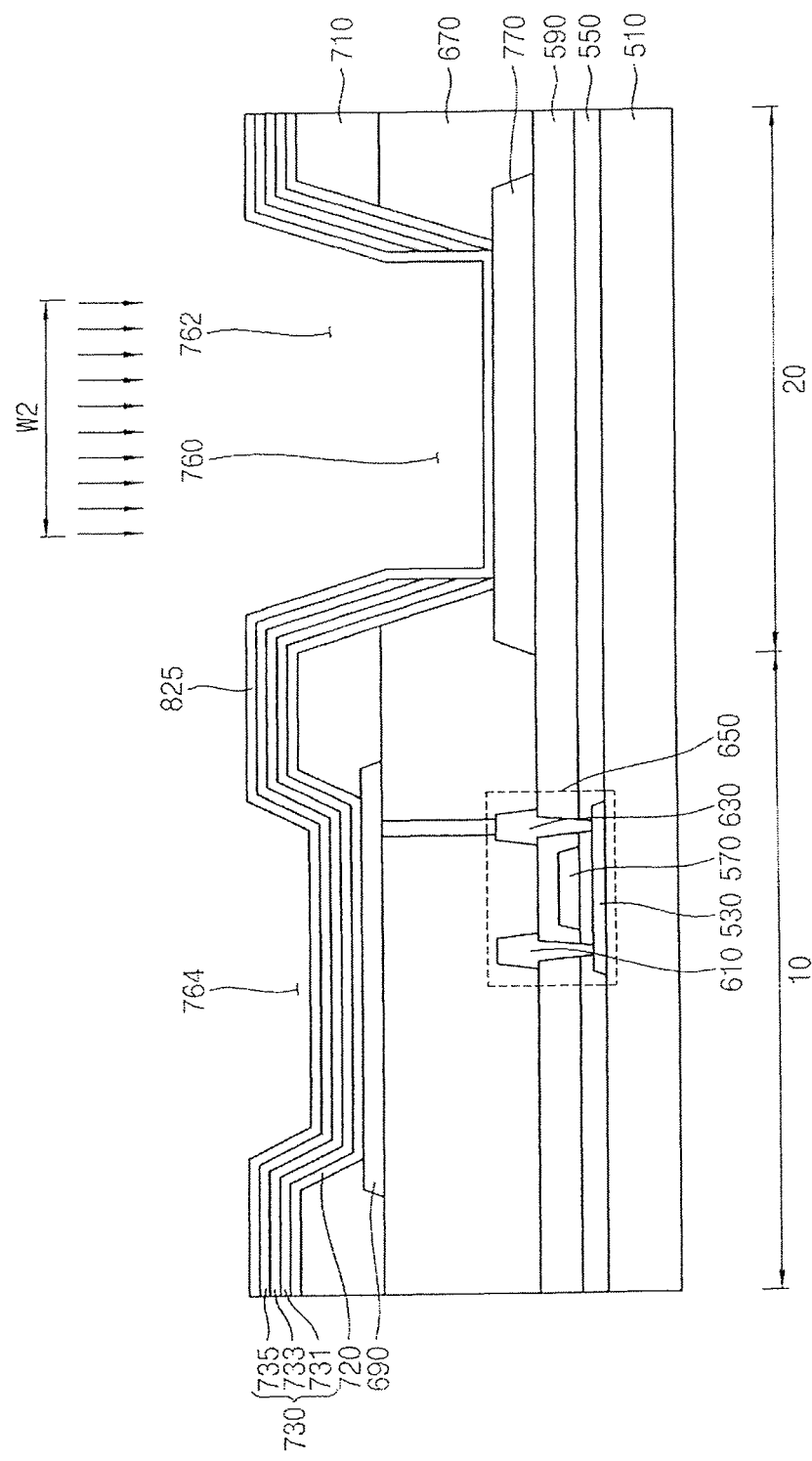

Referring to FIG. 9, a preliminary second common layer 825 may be formed on the light emitting structure 730 and the auxiliary power supply wire 770. After the preliminary second common layer 825 is formed, the auxiliary power supply wire 770 may be irradiated by a laser beam having a second width W2 such that a portion of the auxiliary power supply wire 770 is exposed. The second width W2 may be smaller than the first width W1. Accordingly, a portion of the preliminary second common layer 825, located on the auxiliary power supply wire 770, may be removed by the laser beam. However, the portion of the preliminary second common layer 825, located on the sidewall of the first and second openings 760 and 762, is not irradiated with the laser beam.

Figure 10:
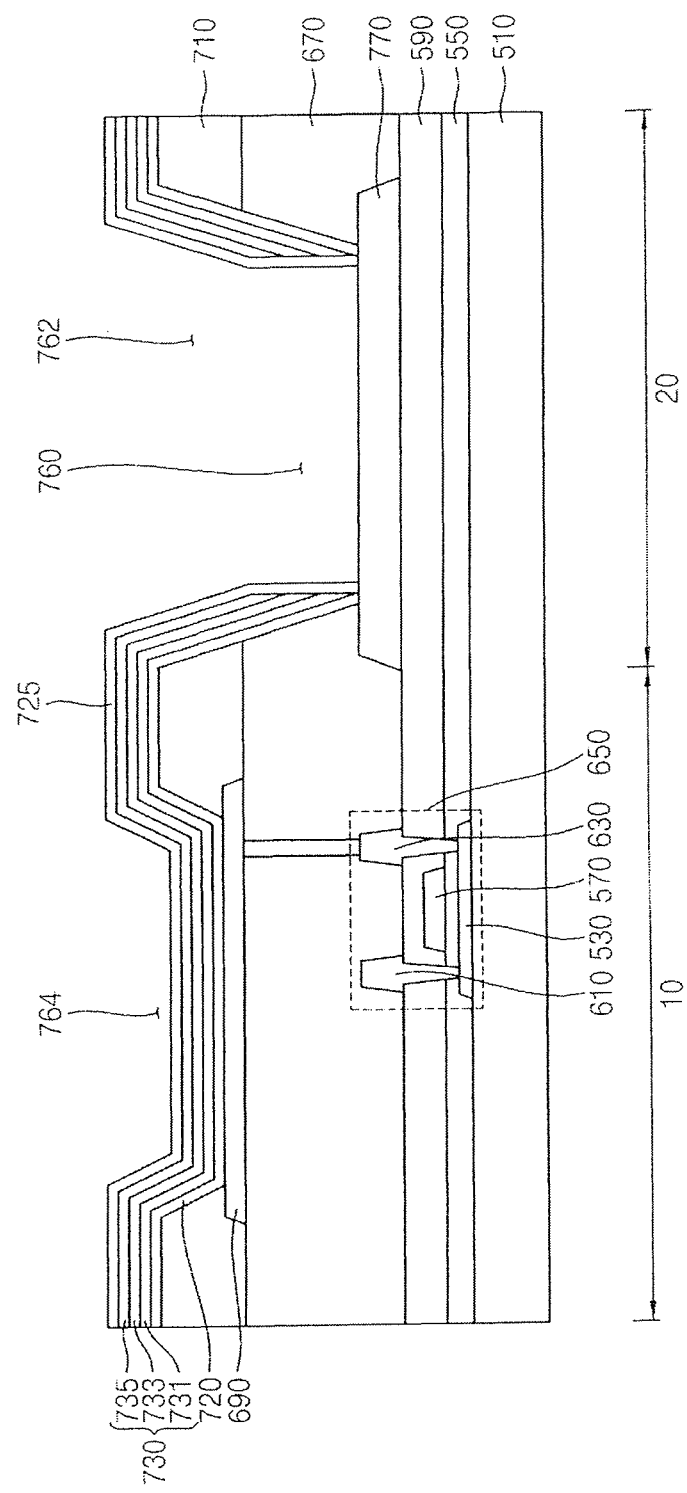

Referring to FIG. 10, after the laser beam having the second width W2 has irradiated the preliminary second common layer 825, a second common layer 725 may be formed. The second common layer 725 may be formed on the light emitting structure 730. The second common layer 725 may cover the light emitting structure 730, and the second common layer 725 may expose a portion of the auxiliary power supply wire 770. The second common layer 725 may be formed on the light emitting structure 730, and in the sidewall of the first and second openings 760 and 762. The second common layer 725 may include an ETL and an EIL. For example, in the sidewall of the first and second openings 760 and 762, the ETL may be formed on the second light emitting layer 735, and the EIL may be formed on the ETL. In an exemplary embodiment of the present invention, the second common layer 725 may cover the first CGL 733 such that the first CGL 733 is not exposed in the sidewall of the first and second openings 760 and 762. For example, in the sidewall of the first and second openings 760 and 762, the second common layer 725 may cover a distal end portion of the first common layer 720, a distal end portion of the first light emitting layer 731, a distal end portion of the first CGL 733, and a distal end portion of the second light emitting layer 735. In this case, the distal end portion of the first common layer 720, the distal end portion of the first light emitting layer 731, the distal end portion of the first CGL 733, and the distal end portion of the second light emitting layer 735, respectively, may be ends that face the auxiliary power supply wire 770. In addition, the second common layer 725 may be in contact with a portion of an upper surface of the auxiliary power supply wire 770.

The ETL may be formed using an electron transport material, hi addition, the EIL may be formed using an electron injection material.

Figure 11:
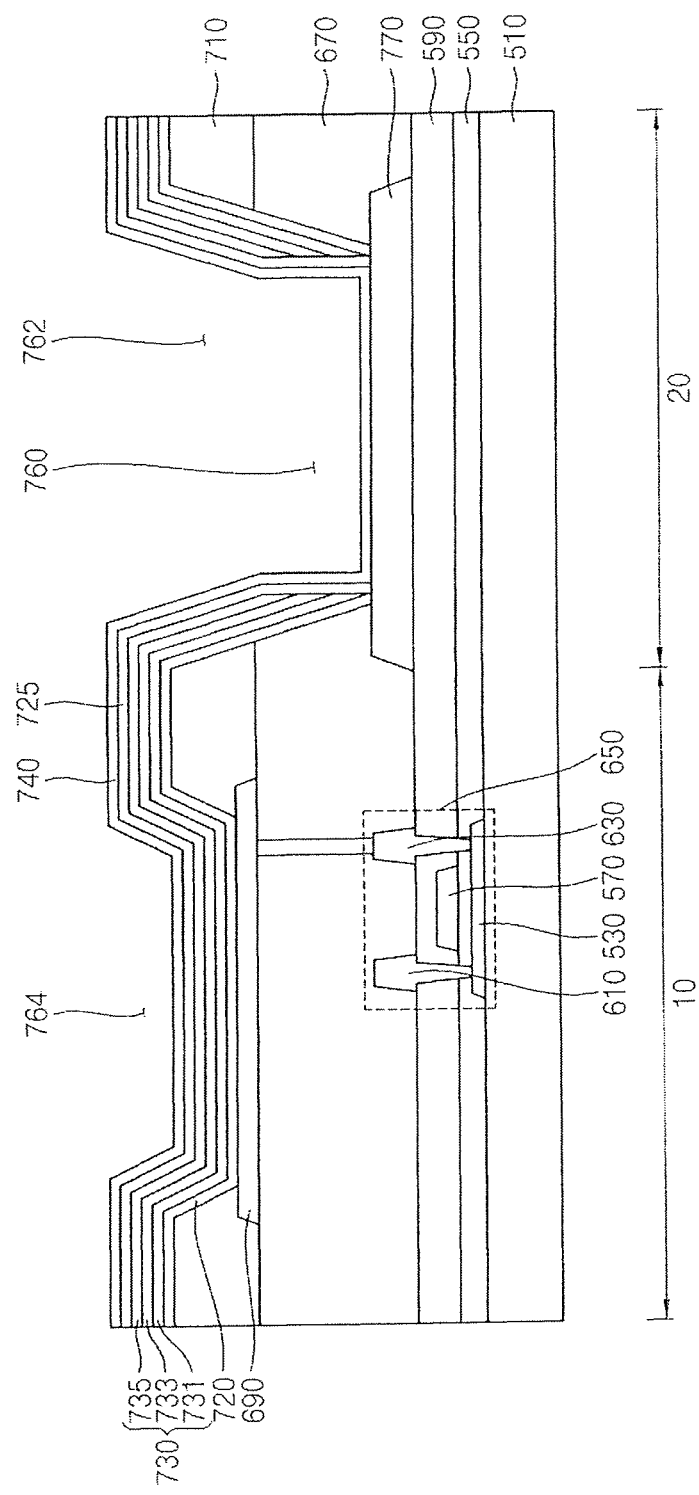

Referring to FIG. 11, an upper electrode 740 may be formed on the second common layer 725 and the auxiliary power supply wire 770. The upper electrode 740 may cover the second common layer 725. In addition, the upper electrode 740 may be in direct contact with the auxiliary power supply wire 770. The upper electrode 740 may be formed using a metal, a metal alloy, metal nitride, a conductive metal oxide, transparent conductive materials, etc.

Figure 12:

Referring to FIG. 12, an encapsulation substrate 750 may be formed on the upper electrode 740. The encapsulation substrate 750 and the substrate 510 may be formed using a same material. For example, the encapsulation substrate 750 may be formed using quartz, synthetic quartz, calcium fluoride, fluoride-doped quartz, sodalime glass, a non-alkali glass, etc. In an exemplary embodiment of the present invention, the encapsulation substrate 750 may include a transparent inorganic material or a flexible plastic. For example, the encapsulation substrate 750 may include a flexible transparent resin.

A color filter 780 may be formed on a lower surface of the encapsulation substrate 750, and may overlap the lower electrode 690. The color filter 780 may include a red color filter, a green color filter, and/or a blue color filter. Alternatively, the color filter 780 may include a yellow color filter, a cyan color filter, and/or a magenta color filter. The color filter 780 may be formed using a photosensitive resin (or color photoresist), etc.

Figure 13:
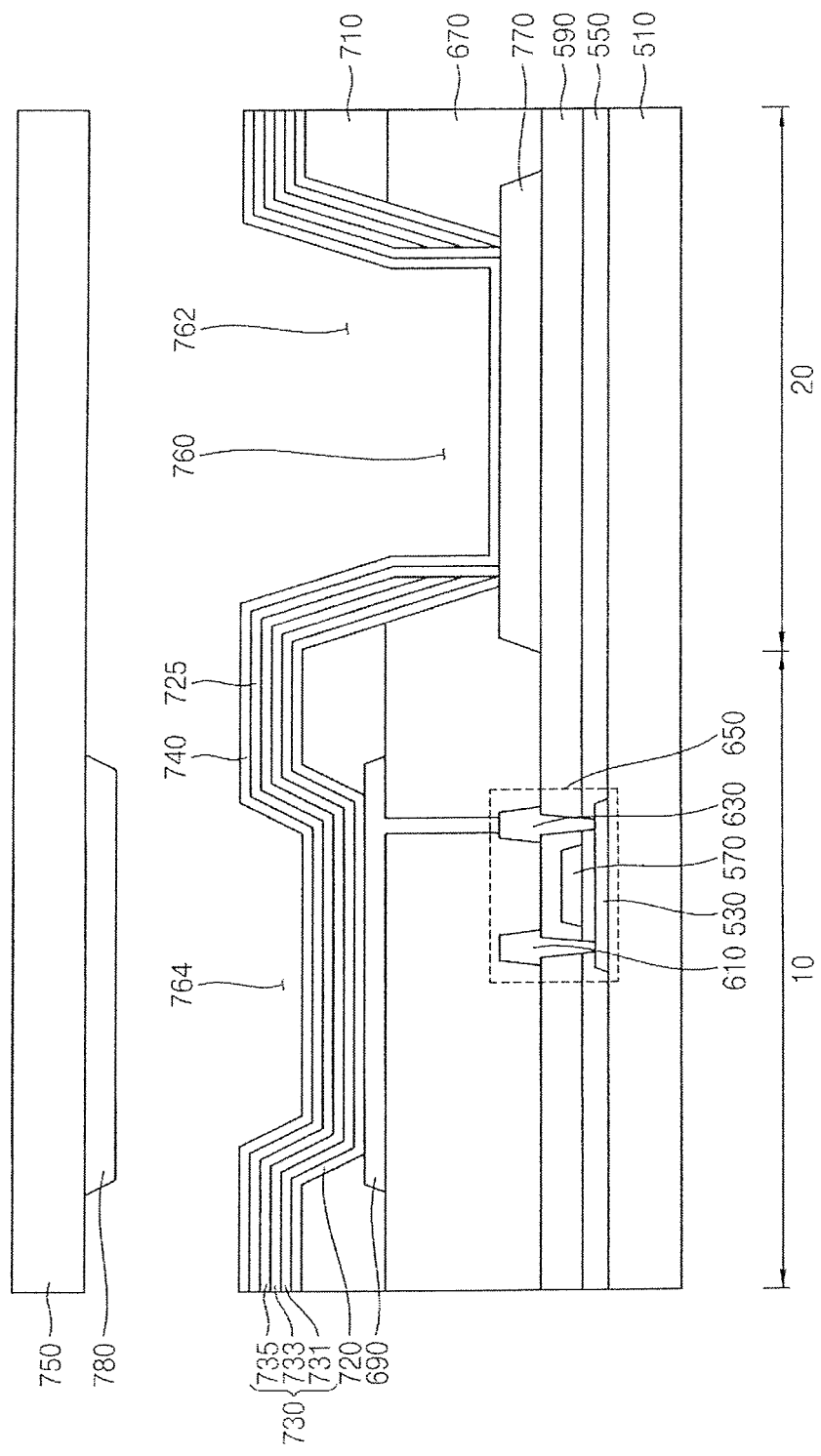

Referring to FIG. 13, the encapsulation substrate 750 and the substrate 510 may be combined (e.g., sealed together) For example, combining the encapsulation substrate 750 and the substrate 510 may include fixing the encapsulation substrate 750 and the substrate 510 together. Accordingly, the OLED device 100 illustrated in FIG. 1 may be manufactured. Since the second common layer 725 covers the first CGL 733, the first CGL 733 and the upper electrode 740 may be electrically insulated. Accordingly, the first CGL 733 and the upper electrode 740 might not be shorted (e.g., electrically connected to each other), and the OLED device 100 may emit light of a white color in the light emitting region 10.

Figure 14:
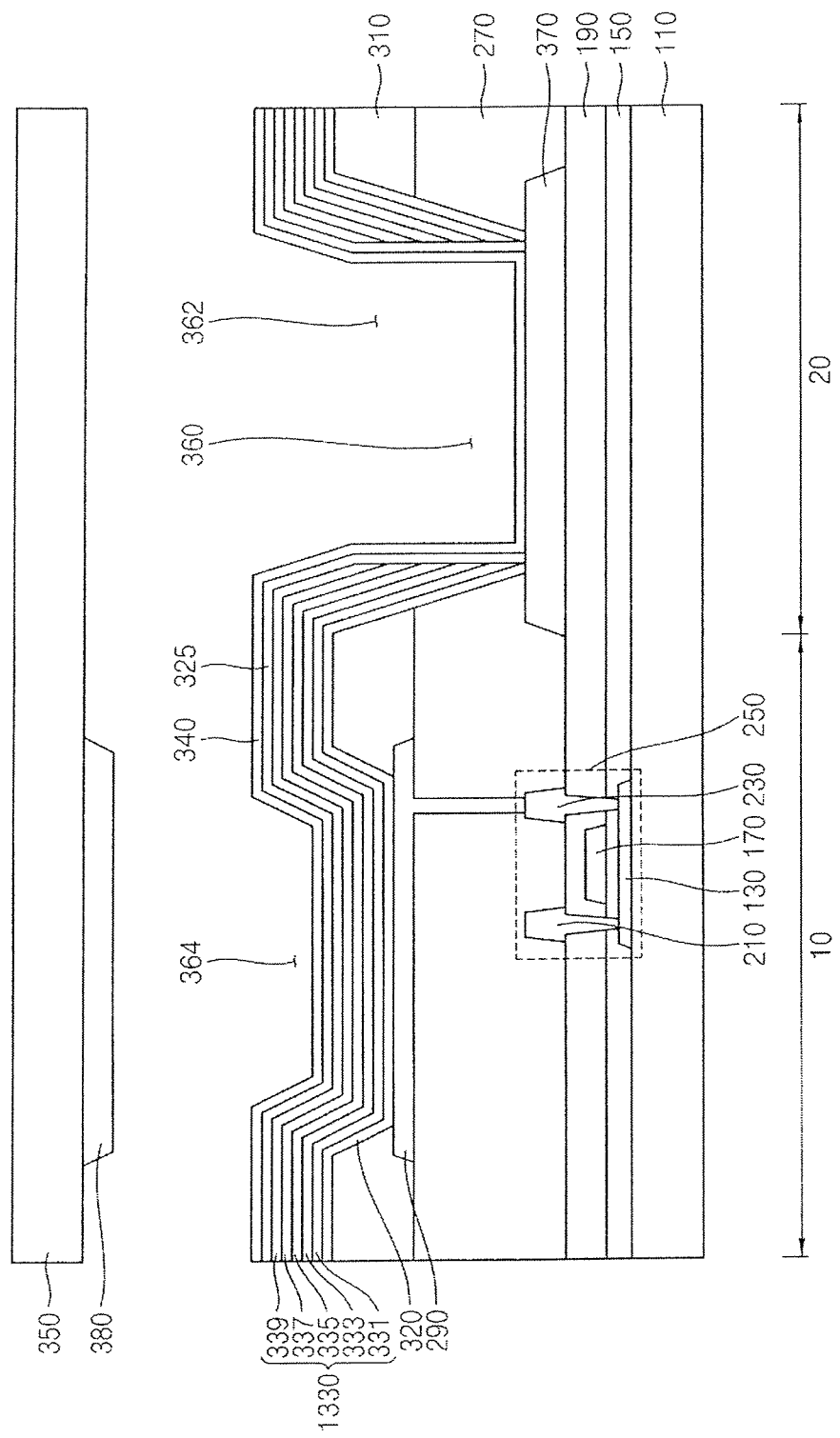
FIG. 14 is a cross-sectional view illustrating an MED device, according to an exemplary embodiment of the present invention.

FIG. 14 is a cross-sectional view illustrating an OLED device, according to an exemplary embodiment of the present invention. The OLED device illustrated in FIG. 14 may have a configuration substantially the same as or similar to that of the OLED device 100 described with reference to FIGS. 1 and 2, except for a light emitting structure 1330. In FIG. 14, detailed descriptions of elements previously described with reference to FIGS. 1 and 2 may be omitted for brevity.

Referring to FIG. 14, an OLED device may include a substrate 110, a semiconductor element 250, an auxiliary power supply wire 370, a planarization layer 270, a lower electrode 290, a pixel defining layer 310, a first common layer 320, a light emitting structure 1330, a second common layer 325, an upper electrode 340, a color filter 380, an encapsulation substrate 350, etc. The semiconductor element 250 may include an active layer 130, a gate insulation layer 150, a gate electrode 170, an insulating interlayer 190, a source electrode 210, and a drain electrode 230. The light emitting structure 1330 may include a first light emitting layer 331, a first CGL 333, a second light emitting layer 335, a second CGL 337, and a third light emitting layer 339. As illustrated in FIG. 2, the first common layer 320 may include an HIL 321 and an HTL 322. In addition, the second common layer 325 may include an ETL 326 and an EIL 327.

The light emitting structure 1330 may be disposed on the first common layer 320, and may expose a portion of the auxiliary power supply wire 370. The light emitting structure 1330 may be disposed on the first common layer 320, in the sidewall of each of the first and second openings 360 and 362. For example, in the sidewall of each of the first and second openings 360 and 362, the first light emitting layer 331 may be disposed on the first common layer 320, and the first CGL 333 may be disposed on the first light emitting layer 331. In addition, in the sidewall of each of the first and second openings 360 and 362, the second light emitting layer 335 may be disposed on the first CGL 333, and the second CGL 337 may be disposed on the second light emitting layer 335.

In an exemplary embodiment of the present invention, the light emitting structure 1330 may have a tandem structure. For example, the first light emitting layer 331 may include a light emitting layer that may emit light having a red color, and the second light emitting layer 335 may include a light emitting layer that may emit light having a green color. In addition, the third light emitting layer 339 may include a light emitting layer that may emit light having a blue color. The first CGL 333 may be interposed between the light emitting layer that may emit light having a red color and the light emitting layer that may emit light having a green color. The second CGL 337 may be interposed between the light emitting layer that may emit light having a green color and the light emitting layer that may emit light having a blue color. A light having a white color may be generated by mixing the above-cited lights having the red, blue, and green colors. The first light emitting layer 331 may include a light emission material that may emit light having a red color. The second light emitting layer 335 may include a light emission material that may emit light having a green color. In addition, the third light emitting, layer 339 may include a light emission material that may emit light having a blue color. Alternatively, the first light emitting layer 331 may include a yellow phosphor material, and the second light emitting layer 335 may include a blue fluorescent material. In addition, the third light emitting layer 339 may include a blue fluorescent material. A light having a white color may be generated by mixing the light emitted from the yellow phosphor material and the blue fluorescent material.

The second common layer 325 may be disposed on the light emitting structure 1330. In addition, the second common layer 325 may cover the light emitting structure 1330, and may expose a portion of the auxiliary power supply wire 370. The second common layer 325 may be disposed on the light emitting structure 1330, in the sidewall of each of the first and second openings 360 and 362. As described above, the second common layer 325 may include the ETL 326 and the EIL 327. For example, in the sidewall of each of the first and second openings 360 and 362, the ETL 326 may be disposed on the light emitting structure 1330 (e.g., on the third light emitting layer 339), and the EIL 327 may be disposed on the ETL 326. In an exemplary embodiment of the present invention, the second common layer 325 may cover the first CGL 333 and the second CGL 337 such that the first CGL 333 and the second CGL 337 are not exposed in the sidewall of each of the first and second openings 360 and 362. For example, in the sidewall of each of the first and second openings 360 and 362, the second common layer 325 may cover a distal end portion of the first common layer 320, a distal end portion of the first light emitting layer 331, a distal end portion of the first CGL 333, a distal end portion of the second light emitting layer 335, a distal end portion of the second CGL 337, and a distal end portion of the third light emitting layer 339. In this case, the distal end portion of the first common layer 320, the distal end portion of the first light emitting layer 331, the distal end portion of the first CGL 333, the distal end portion of the second light emitting layer 335, the distal end portion of the second CGL 337, and the distal end portion of the third light emitting layer 339, respectively, may be ends that face the auxiliary power supply wire 370. In addition, in the first and second openings 360 and 362, the second common layer 325 may be in contact with a portion of an upper surface of the auxiliary power supply wire 370.

Figure 15:
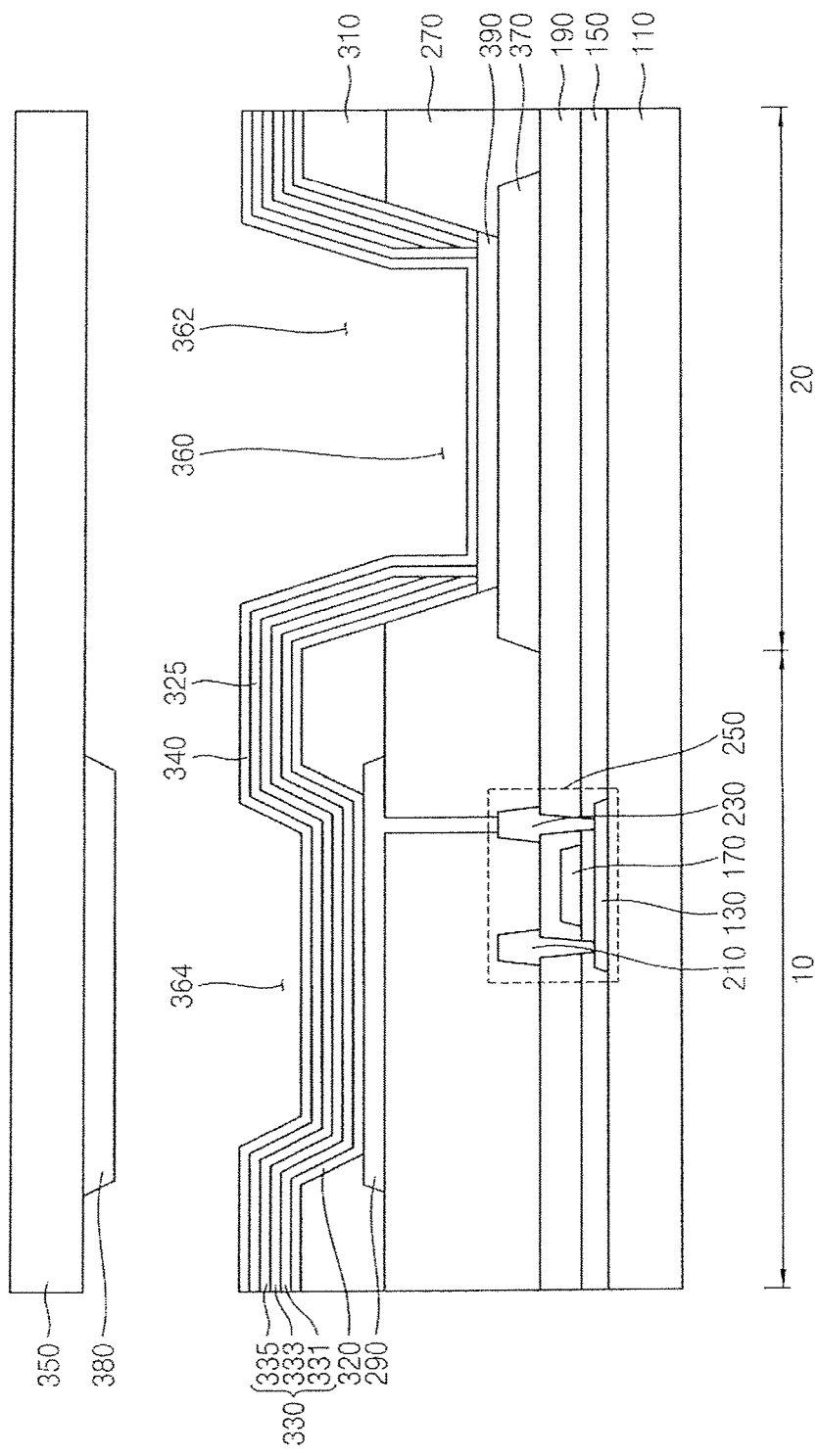
FIG. 15 is a cross-sectional view illustrating the OLED device, according to an exemplary embodiment of the present invention.
Figure 16:
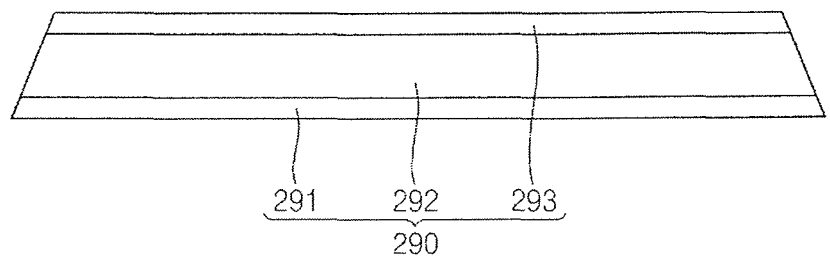
FIG. 16 is a cross-sectional view illustrating a lower electrode of FIG. 15, according to an exemplary embodiment of the present invention.

FIG. 15 is a cross-sectional view illustrating the OLED device, according to an exemplary embodiment of the present invention. FIG. 16 is a cross-sectional view illustrating a lower electrode of FIG. 15, according to an exemplary embodiment of the present invention. The OLED device illustrated in FIG. 15 may have a configuration substantially the same as or similar to that of an OLED device 100 described with reference to FIGS. 1 and 2, except for a conductive pattern 390. In FIGS. 15 and 16, detailed descriptions of elements previously described with reference to FIGS. 1 and 2 may be omitted for brevity.

Referring to FIGS. 15 and 16, an OLED device may include a substrate 110, a semiconductor element 250, an auxiliary power supply wire 370, a planarization layer 270, a lower electrode 290, a conductive pattern 390, a pixel defining layer 310, a first common layer 320, a light emitting structure 330, a second common layer 325, an upper electrode 340, a color filter 380, an encapsulation substrate 350, etc. The semiconductor element 250 may include an active layer 130, a gate insulation layer 150, a gate electrode 170, an insulating interlayer 190, a source electrode 210, and a drain electrode 230. The light emitting structure 330 may include a first light emitting layer 331, a first CGL 333, and a second light emitting layer 335. As illustrated in FIG. 2, the first common layer 32.0 may include an HIL 321 and an HTL 322. In addition, the second common layer 325 may include an ETL 326 and an EIL 327. As illustrated in FIG. 16, the lower electrode 290 may include a first transparent electrode layer 291, a reflective electrode layer 292, and a second transparent electrode layer 293.

The lower electrode 290 may be disposed in the light emitting region 10 on the planarization layer 270.

The OLED device may display an image in a direction toward the encapsulation substrate 350 in the light emitting region 10 (e.g., a top emission structure). Thus, the lower electrode 290 may include a light reflective layer. For example, as illustrated in FIG. 16, the lower electrode 290 may have a multilayer structure. The multilayer structure of the lower electrode 290 may include the first transparent electrode layer 291, the reflective electrode layer 292, and the second transparent electrode layer 293. The first transparent electrode layer 291 may be disposed in the light emitting region 10 on the planarization layer 270, and the reflective electrode layer 292 and the second transparent electrode layer 293 may be sequentially disposed on the first transparent electrode layer 291. The first transparent electrode layer 291 and the second transparent electrode layer 293 may have a first thickness, and the reflective electrode layer 292 may have a second thickness. The second thickness of the reflective electrode layer 292 may be greater than the first thickness of first transparent electrode layer 291. The first transparent electrode layer 291 and the second transparent electrode layer 293 may include a same material. The reflective electrode layer 292 may be interposed between the first transparent electrode layer 291 and the second transparent electrode layer 293.

The first transparent electrode layer 291 may cover an uneven upper surface of the planarization layer 270. Since the first transparent electrode layer 291 is disposed on the planarization layer 270, the first transparent electrode layer 291 may be used to form the reflective electrode layer 292. Since the second transparent electrode layer 293 is disposed on the reflective electrode layer 292, a color coordinate of the OLED device may be controlled as needed. The reflective electrode layer 292 may reflect light. For example, the reflective electrode layer 292 may reflect a light emitted from the first light emitting layer 330 toward the front of the OLED device. Thus, the lower electrode 290, including the reflective electrode layer 292, may be substantially opaque. For example, the reflective electrode layer 292 may include a metal, a metal alloy, metal nitride, a conductive metal oxide, etc. Each of the first transparent electrode layer 291 and the second transparent electrode layer 293 may be substantially transparent. Each of the first transparent electrode layer 291 and the second transparent electrode layer 293 may include transparent conductive materials, etc.

The conductive pattern 390 may be interposed between the auxiliary power supply wire 370 and the upper electrode 340. The conductive pattern 390 may increase contact characteristics of the upper electrode $40 and the auxiliary power supply wire 370.

The conductive pattern 390 and the lower electrode 290 may be simultaneously formed using the same material. For example, the conductive pattern 390 may have a multilayer structure.

The present invention may be applied to various display devices including an organic light emitting display device. For example, the present invention may be applied to vehicle display devices, ship display devices, aircraft display devices, portable communication devices, display devices for display which display information transfer, medical display devices, etc.

While the present invention has been particularly shown and described with reference to exemplary embodiments thereof, it will be apparent to those of ordinary skill in the art that various changes in form and detail may be made therein without departing from the spirit and scope of the present invention.

What is claimed is:

1. An organic light emitting display (OLED) device, comprising:
  a substrate including a light emitting region and a peripheral region;
  an auxiliary power supply wire disposed in the peripheral region of the substrate;
  a lower electrode disposed in the light emitting region of the substrate;
  a first insulation layer disposed on the substrate, wherein the first insulation layer has an opening that exposes a portion of the lower electrode in the light emitting region, and the first insulation layer has an opening that exposes a portion of the auxiliary power supply wire in the peripheral region;
  a light emitting structure disposed on the first insulation layer and the lower electrode, wherein the light emitting structure has an opening that exposes the auxiliary power supply wire;
  an upper common layer disposed on the light emitting structure, the upper common layer covering the light emitting structure, wherein the upper common layer has an opening that exposes the auxiliary power supply wire; and
  an upper electrode disposed on the upper common layer, wherein the upper electrode contacts the auxiliary power supply wire.

2. The OLED device of claim 1, further comprising:
  a lower common layer disposed between the lower electrode and the light emitting structure,
  wherein the lower common layer has an opening that exposes the auxiliary power supply wire.

3. The OLED device of claim 2, wherein the light emitting structure includes:
  a first light emitting layer disposed on the lower common layer;

a first charge generating layer disposed on the first light emitting layer; and a second light emitting layer disposed on the first charge generating layer.

4. The OLED device of claim 3, further comprising:

a planarization layer interposed between the first insulation layer and the substrate, the planarization layer including a first opening that exposes a portion of the auxiliary power supply wire.

5. The OLED device of claim 4, wherein the first insulation layer includes a second opening that exposes a portion of the auxiliary power supply wire, and the first insulation layer includes a third opening that exposes a portion of the lower electrode.

6. The OLED device of claim 5, wherein the first opening overlaps the second opening, and the lower common layer, the first light emitting layer, the first charge generating layer, and the second light emitting layer are sequentially disposed on a sidewall of each of the planarization layer defining the first opening arid the first insulation layer defining the second opening.

7. The OLED device of claim 6, wherein the upper common layer covers the first charge generating layer such that the first charge generating layer is not exposed in the sidewall of either of the planarization layer and the first insulation layer.

8. The OLED device of claim 7, wherein the upper common layer covers a distal end portion of the lower common layer, a distal end portion of the first light emitting layer, a distal end portion of the first charge generating layer, and a distal end portion of the second light emitting layer in the sidewall of each of the planarization layer and the first insulation layer, and the upper common layer is in contact with an upper surface of the auxiliary power supply wire.

9. The OLED device of claim 4, wherein the lower electrode includes:

a first transparent electrode layer disposed on the planarization layer;

a reflective electrode layer disposed on the first transparent electrode layer; and a second electrode transparent layer disposed on the reflection electrode layer.

10. The OLED device of claim 9, further comprising:

a conductive pattern interposed between the auxiliary power supply wire and the upper electrode, wherein the conductive pattern and the lower electrode are simultaneously formed including a same material.

11. The OLED device of claim 3, wherein the light emitting structure further includes:

a second charge generating layer disposed on the second light emitting layer; and a third light emitting layer disposed on the second charge generating layer, wherein the upper common layer covers the second charge generating layer such that the second charge generating layer is not exposed in the light emitting and peripheral regions.

12. The OLED device of claim 1, further comprising:

a semiconductor element spaced apart from the auxiliary power supply wire, the semiconductor element being interposed between the substrate and the lower electrode, wherein the semiconductor element includes:

an active layer disposed on the substrate;

a gate insulation layer disposed on the active layer;

a gate electrode disposed on the gate insulation layer;

an insulating interlayer disposed on the gate electrode; and source and drain electrodes disposed on the insulating interlayer, and wherein the source and drain electrodes and the auxiliary power supply wire include a same material.

13. The OLED device of claim 1, further comprising:

an encapsulation substrate disposed on the upper electrode; and a color filter disposed on a lower surface of the encapsulation substrate, the color filter overlapping the lower electrode.

14. The OLED device of claim 1, wherein the lower common layer includes a hole injection layer and a hole transport layer, and the upper common layer includes an electron transport layer and an electron injection layer.

* * * * *